US009202635B2

(12) United States Patent
Ma et al.

(10) Patent No.: US 9,202,635 B2
(45) Date of Patent: Dec. 1, 2015

(54) COMPOSITE SUBSTRATE FOR COUNTER ELECTRODE OF DYE-SENSITIZED SOLAR CELL

(75) Inventors: Chen-Chi Martin Ma, Hsinchu (TW); Chuan-Yu Yen, Hsinchu (TW); Shu-Hang Liao, Hsinchu (TW); Ming-Yu Yen, Hsinchu (TW); Min-Chien Hsiao, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 1424 days.

(21) Appl. No.: 12/588,379

(22) Filed: Oct. 14, 2009

(65) Prior Publication Data

US 2010/0154871 A1    Jun. 24, 2010

(30) Foreign Application Priority Data

Dec. 18, 2008  (TW) .............................. 97149506 A (51) Int. Cl.
| | |
|---|---|
| *H01L 31/02* | (2006.01) |
| *H01G 9/20* | (2006.01) |
| *B82Y 10/00* | (2011.01) |
| *B82Y 30/00* | (2011.01) |
| *C08J 3/20* | (2006.01) |
| *C08J 5/00* | (2006.01) |
| *C08J 5/04* | (2006.01) |
| *H01L 51/44* | (2006.01) |

(52) U.S. Cl.
CPC .............. *H01G 9/2022* (2013.01); *B82Y 10/00* (2013.01); *B82Y 30/00* (2013.01); *C08J 3/203* (2013.01); *C08J 5/005* (2013.01); *C08J 5/04* (2013.01); *C08J 2367/02* (2013.01); *H01G 9/2031* (2013.01); *H01G 9/2059* (2013.01); *H01L 51/444* (2013.01); *Y02E 10/542* (2013.01)

(58) Field of Classification Search
CPC ......... B82Y 10/00; B82Y 20/00; C08J 3/203; C08J 2367/02; H09G 9/2022; H09G 9/2031; H09G 9/2059; H09G 9/20591; Y02E 10/542
USPC .......................................... 136/263; 264/105
See application file for complete search history.

(56) References Cited

U.S. PATENT DOCUMENTS

2005/0001352 A1 *  1/2005  Ma et al. ....................... 264/241

FOREIGN PATENT DOCUMENTS

JP        2006108080 A   *   4/2006

OTHER PUBLICATIONS

Tseng et al., "Functionalizing Carbon Nanotubes by Plasma Modification for the Preparation of Covalent-Integrated Epoxy Composites", Chem. Mater., 2007 (published online 2006).*
Liao et al., "Preparation and properties of carbon nanotube reinforced vinyl ester/nanocomposite bipolar plates for polymer electrolyte fuel cells", Journal of Power Sources, Oct. 26, 2007.*

* cited by examiner

*Primary Examiner* — Matthew Martin
(74) *Attorney, Agent, or Firm* — Bacon & Thomas, PLLC (57) ABSTRACT

A substrate for counter electrode of dye-sensitized solar cell is made of a composite material, which is prepared by: a) compounding vinyl ester and graphite powder to form bulk molding compound (BMC) material, the graphite powder content ranging from 60 wt % to 95 wt % based on the total weight of the graphite powder and vinyl ester, wherein 0.01-10 wt % of an electrically conductive filler, based on the weight of the vinyl ester resin, is optionally added during the compounding; b) molding the BMC material from step a) to form a substrate for the counter electrode having a desired shaped at 80-200° C. and 500-4000 psi.

29 Claims, 6 Drawing Sheets

COMPOSITE SUBSTRATE FOR COUNTER ELECTRODE OF DYE-SENSITIZED SOLAR CELL

FIELD OF THE INVENTION

The present invention is related to a composite substrate for making a counter electrode of a dye-sensitized solar cell, and in particular a composite substrate for making a counter electrode of a dye-sensitized solar cell, which contains an electrically conductive filler such as carbon nanotubes and is prepared by a bulk molding compound (BMC) process.

BACKGROUND OF THE INVENTION

The dye-sensitized solar cells (DSSCs) were originally developed by M. Gratzel, hence they are also called the Gratzel cells. Essentially, a DSSC is comprised of a photoanode, electrolyte, and platinum counter electrodes. The photoanode is basically a transparent and electrically conductive glass substrate formed by coating a layer of ITO or FTO film over the glass substrate, and an insulating surface formed over the conductive glass substrate includes a semiconductor film having titanium dioxide ($TiO_2$) particles, as well as dyes adsorbed onto the semiconductor film. The Pt counter electrodes are deposited on a transparent and electrically conductive glass substrate. Electrons pass through the glass substrate on which the PT electrodes are deposited during the course of electricity generation of DSSC; accordingly the performance of DSSC will be affected by resistivity of the electrically conductive glass substrate. Further, the electrically conductive glass substrate has a relatively high share in the manufacturing costs of a DSSC.

To this date, the industry is still continuously looking for a substrate for DSCC counter electrodes having a high electric conductivity, excellent mechanical properties, a high thermal stability and a high dimension stability.

U.S. Pat. No. 7,090,793 discloses a composite bipolar plate of polymer electrolyte membrane fuel cells (PEMFC), which is prepared as follows: a) preparing a BMC material containing a vinyl ester resin and a graphite powder, the graphite powder content of BMC material ranging from 60 wt % to 80 wt %, based on the compounded mixture; b) molding the BMC material from step a) to form a bipolar plate having a desired shape at 80-200° C. and 500-4000 psi, wherein the graphite powder is of 10 mesh-80 mesh; less than 10 wt % of the particles of the graphite powder are larger than 40 mesh, and the remaining particles of the graphite powder have a size of 40-80 mesh. The disclosure of this US patent is incorporated herein by reference.

Taiwan Invention Patent No. 286579 discloses a polymer composite bipolar plate for a PEMFC, which is prepared by: a) compounding phenolic resin and carbon fillers to form a BMC material, the BMC material containing 60 to 80 wt % graphite powder, 1 to 10 wt % carbon fiber; and one or more conductive carbon fillers selected from: 5 to 30 wt % Ni-planted graphite powder, 2 to 8 wt % Ni-planted carbon fiber and 0.01 to 0.3 wt % carbon nanotubes, based on the weight of the phenolic resin, provided that the sum of the amounts of the carbon fiber and Ni-planted carbon fiber is not greater than 10 wt %; b) molding the BMC material from step a) to form a bipolar plates having a desired shape at 80-200° C. and 500-4000 psi. The carbon nanotubes used are 1) single-wall or multi-wall carbon nanotubes; 2) having a diameter of 0.7-50 nm; a length of 1-1000 μm; and 4) a specific surface area of 40-1000 $m^2/g$. The disclosure of this Taiwan patent is incorporated herein by reference.

SUMMARY OF THE INVENTION

A primary objective of the present invention is to provide a composite substrate for DSSC counter electrodes having a high electric conductivity, excellent mechanical properties, a high thermal stability and a high dimension stability.

The present invention uses a vinyl ester resin, a graphite powder, and optionally an electrically conductive filler via a BMC process to prepare a composite substrate for DSSC counter electrodes.

Preferably, a metallic net is embedded in the composite substrate, such as stainless steel net, to enhance the electric conductivity, thermal conductivity and mechanical properties of the composite substrate for DSSC counter electrodes.

The present invention discloses a dye-sensitized solar cell comprising a composite substrate on which a counter electrode is deposited, wherein said composite substrate comprises a cured vinyl ester resin and a graphite powder dispersed in said cured vinyl ester resin, wherein said cured vinyl ester resin comprises 60 to 80 wt % of said graphite powder, based on the weight of said cured vinyl ester resin and particles of said graphite powder have a size of 10-80 mesh. Preferably, less than 10 wt % of the particles of the graphite powder are larger than 40 mesh, and the remaining particles of the graphite powder have a size of 40-80 mesh.

Preferably, said composite substrate further comprises 0.01-10 wt % of an electrically conductive filler, based on the weight of the vinyl ester resin, is dispersed in said cured vinyl ester resin, wherein said electrically conductive filler is selected form the group consisting of carbon fiber, carbon black, metal plated carbon fiber, metal plated carbon black, carbon nanotube (CNT), modified CNT, and a mixture thereof.

Preferably, said electrically conductive filler is CNT, and said cured vinyl ester resin further comprises 0.01-10 wt % of a polyether amine dispersant, based on the weight of the cured vinyl resin. More preferably, said polyether amine is polyether diamine having two terminal amino groups, and having a weight-averaged molecular weight of 200-4000. Most preferably, the polyether diamine is poly(propylene glycol)-bis-(2-aminopropyl ether) or poly(butylene glycol)-bis-(2-aminobutyl ether).

Preferably, said electrically conductive filler is modified CNT which is a carbon nanotube modified with polyether amine.

Preferably, said electrically conductive filler is modified CNT which is modified by acyl chlorination-amidization reaction.

Preferably, said CNT is a carbon nanohorn, a carbon nanocapsule, or a single-walled, double-walled or multi-walled carbon nanotube.

Preferably, said CNT is a single-walled, double-walled or multi-walled carbon nanotube having a diameter of 1-50 nm, a length of 1-25 μm, a specific surface area of 150-250 $m^2g^{-1}$, and an aspect ratio of 20-2500 $m^2/g$.

Preferably, said composite substrate for counter electrodes further comprises a metallic net being embedded in the molded BMC material. More preferably, said metallic net is made of a material selected from the group consisting of Al, Ti, Fe, Cu, Ni, Zn, Ag, Au and an alloy thereof, and the metallic net has a thickness of 0.01-3 mm, a mesh of 0.1-15 mm, and strings having a diameter of 0.01-3.0 mm.

Preferably, said composite substrate is prepared by a process comprising the following steps:

a) compounding vinyl ester and graphite powder to form a bulk molding compound (BMC) material, the graphite powder content ranging from 60 wt % to 95 wt % based on the total weight of the graphite powder and vinyl ester, and optionally 0.01-10 wt % of a conductive filler, based on the weight of the vinyl ester resin, being added during the compounding;

b) molding the BMC material from step a) to form a composite substrate having a desired shaped at 80-200° C. and 500-4000 psi.

Preferably, 0.01-10 wt % of a polyether amine dispersant is added to during the compounding in step a), based on the weight of the vinyl ester resin.

Preferably, prior to the compounding in step a), a free radical initiator in an amount of 1-10% is mixed with said vinyl ester resin, based on the weight of said vinyl ester resin. More preferably, said free radical initiator is selected from the group consisting of peroxide, hydroperoxide, azonitrile, redox systems, persulfates, and perbenzoates. Most preferably, said free radical initiator is t-butyl peroxybenzoate.

Preferably, prior to the compounding in step a), a mold releasing agent in an amount of 1-10%, based on the weight of said vinyl ester resin, is mixed with said vinyl ester resin. More preferably, said mold releasing agent is wax or metal stearate. Most preferably, said mold releasing agent is metal stearate.

Preferably, prior to the compounding in step a), a low shrinking agent in an amount of 5-20%, based on the weight of said vinyl ester resin, is mixed with said vinyl ester resin. More preferably, said low shrinking agent is selected from the group consisting of styrene-monomer-diluted polystyrene resin, copolymer of styrene and acrylic acid, poly(vinyl acetate), copolymer of vinyl acetate and acrylic acid, copolymer of vinyl acetate and itaconic acid, and terpolymer of vinyl acetate, acrylic acid and itaconic acid. Most preferably, said low shrinking agent is styrene-monomer-diluted polystyrene resin.

Preferably, prior to the compounding in step a), a tackifier in an amount of 1-10%, based on the weight of said vinyl ester resin, is mixed with said vinyl ester resin. More preferably, said tackifier is selected from the group consisting of alkaline earth metal oxides, alkaline earth metal hydroxides, carbodiamides, aziridines, and polyisocyanates. Most preferably, said tackifier is calcium oxide or magnesium oxide.

Preferably, prior to the compounding in step a), a solvent in an amount of 10-35%, based on the weight of said vinyl ester resin, is mixed with said vinyl ester resin. More preferably, said solvent is selected from the group consisting of styrene monomer, alpha-methyl styrene monomer, chloro-styrene monomer, vinyl toluene monomer, divinyl toluene monomer, diallylphthalate monomer, and methyl methacrylate monomer. Most preferably, said solvent is styrene monomer.

Preferably, said molding in step b) comprises molding the BMC material from step a) with a metallic net being embedded in the molded BMC material. More preferably, said molding in step b) comprises disposing a metallic net in a mold and introducing the BMC material from step a) into said mold. Most preferably, said molding in step b) comprises introducing 40-60 wt % of a predetermined amount of the BMC material from step a) into a mold; disposing a metallic net in the mold and on the BMC material introduced into the mold; and introducing the remaining 60-40 wt % of BMC material from step a) into said mold so that the metallic net is sandwiched by the BMC material.

The vinyl ester resins suitable for use in the present invention have been described in U.S. Pat. No. 6,248,467 which are (meth)acrylated epoxy polyesters, preferably having a glass transition temperature (Tg) of over 180° C. Suitable examples of said vinyl ester resins include, but not limited to, bisphenol-A epoxy-based methacrylate, bisphenol-A epoxy-based acrylate, tetrabromo bisphenol-A epoxy-based methacrylate, and phenol-novolac epoxy-based methacrylate, wherein phenol-novolac epoxy-based methacrylate is preferred. Said vinyl ester resins have a molecular weight of about 500-100000, and an acid value of about 4 mg/lhKOH-40 mg/lhKOH.

DETAILED DESCRIPTION OF THE INVENTION

The present invention discloses a dye-sensitized solar cell containing a composite substrate on which counter electrodes are deposited. The composite substrate is prepared by a bulk molding compound (BMC) process with a bulk molding compound (BMC) material comprising vinyl ester, a graphite powder, and carbon nanotubes.

The vinyl ester resin, initiators, polyether amines, and carbon nanotubes among other materials used in the following examples and controls are described as follows:

Vinyl ester resin: phenolic-novolac epoxy-based (methacrylate) resin having the following structure, which is available as code SW930-10 from SWANCOR IND. CO., LTD, No. 9, Industry South 6 Rd, Nan Kang Industrial Park, Nan-Tou City, Taiwan:

wherein n = 1~3.

Initiator: t-Butyl peroxybenzoate (TBPB) having the following structure, which is available as code TBPB-98 from Taiwan Chiang-Ya Co, Ltd., 4 of 8th Fl, No. 345, Chunghe Rd, Yuanhe City, Taipei Hsien:

Polyether diamine: Jeffamine® D-400 (n=5-6), Mw~400; Jeffamine® D-2000 (n=33), Mw~2000, available from Hunstsman Corp., Philadelphia, Pa., having the following structure:

Multi-Walled CNT (abbreviated as MWCNT) produced by The CNT Company, Inchon, Korea, and sold under a code of $C_{tube}100$. This type of CNT was prepared by a CVD process. The CNTs had a purity of 95%, a diameter of 10-50 nm, a length of 1-25 μm, and a specific surface area of 150-250 $m^2g^{-1}$.

Maleic anhydride (abbreviated as MA) was obtained from Showa Chemical Co., Gyoda City, Saotama, Japan.

Tetrahydrofuran, anhydrous, stabilized (THF) was supplied by Lancaster Co., Eastgare, White Lund, Morecambe, England.

The present invention will be better understood through the following examples, which are merely illustrative, not for limiting the scope of the present invention.

Preparation Example 1

Reactive Carbon Nanotubes Modified by Acyl Chlorination-Amidization Reaction

Scheme 1 depicts an overview of procedures for preparing reactive carbon nanotubes modified by acyl chlorination-amidization reaction.

-continued 15.68 g (0.160 mole) of anhydrous maleic anhydride (MA) was slowly added to a reactor charged with 0.16 mole of poly(oxypropylene) diamine, Jeffamine® D-2000, and then stirred mechanically at 25° C. for 24 hours. The resulting product mixture was washed with deionized water several times, and dried at 100° C. to obtain maleic anhydride-polyether diamine (abbreviated as POAMA). 8 g MWCNTs and 400 mL of nitric acid were introduced into a three-neck flask, where an acidification was carried out under refluxing at 120° C. for 8 hours. The acidified MWCNTs were removed from the flask and washed with terahydrofuran (THF), dried at 100° C., and then introduced into another three-neck flask. Nitrogen was introduced into the flask after vacuuming, 300 ml thionyl chloride ($SOCl_2$) was starting to introduce into flask at a reaction temperature of 70° C. to undergo an acyl-chlorination reaction for 72 hours, followed by an amidization reaction at 90° C. for 24 hours by adding a pyridine solution of POAMA. The resulting product mixture was removed from the flask and washed with deionized water several times, and dried at 100° C. to obtain a final product of reactive carbon nanotubes modified by acyl chlorination-amidization reaction (MWCNTs/POAMA).

Identification of Modified MWCNTs
Identification of Modified MWCNTs by FT-IR

Figure 1:
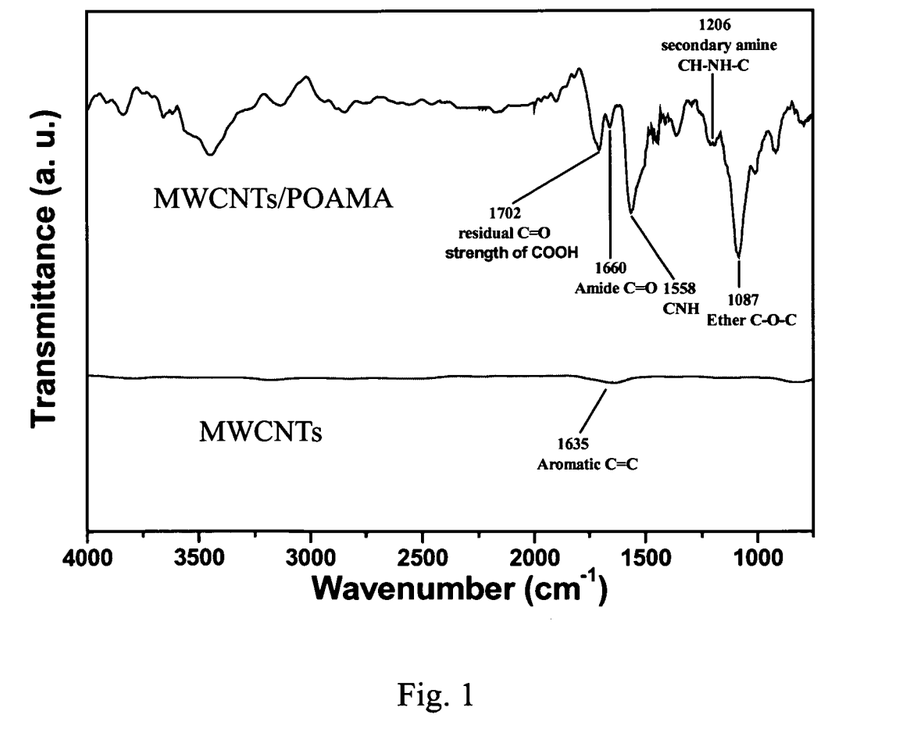
FIG. 1 is FT-IR spectra of pristine Multi-Walled CNTs (abbreviated as MWCNTs), and the modified MWCNTs/POAMA for use in the present invention.

Pristine MWCNTs and the modified MWCNTs/POAMA were subjected to FT-IR analysis to identify functional groups on surfaces thereof. It can be seen from FIG. 1 that the pristine MWCNTs show only one absorption peak of the benzene structure per se of the carbon nanotubes at 1635 $cm^{-1}$, however, the modified MWCNTs/POAMA show an absorption peak of C—O—C segment at 1110 $cm^{-1}$, an absorption peak of C—NH—C bounding in POAMA at 1204 $cm^{-1}$, an absorption peak of N–C=O bounding at 1603 $cm^{-1}$, and absorption peaks of residual non-reacted COOH groups at 1706 and 1562 $cm^{-1}$. The FT-IR spectra in FIG. 1 confirm that POMA has been successfully grafted onto the carbon nanotubes.

Thermogravimetric Analysis (TGA) of Modified MWCNTs

Figure 2:
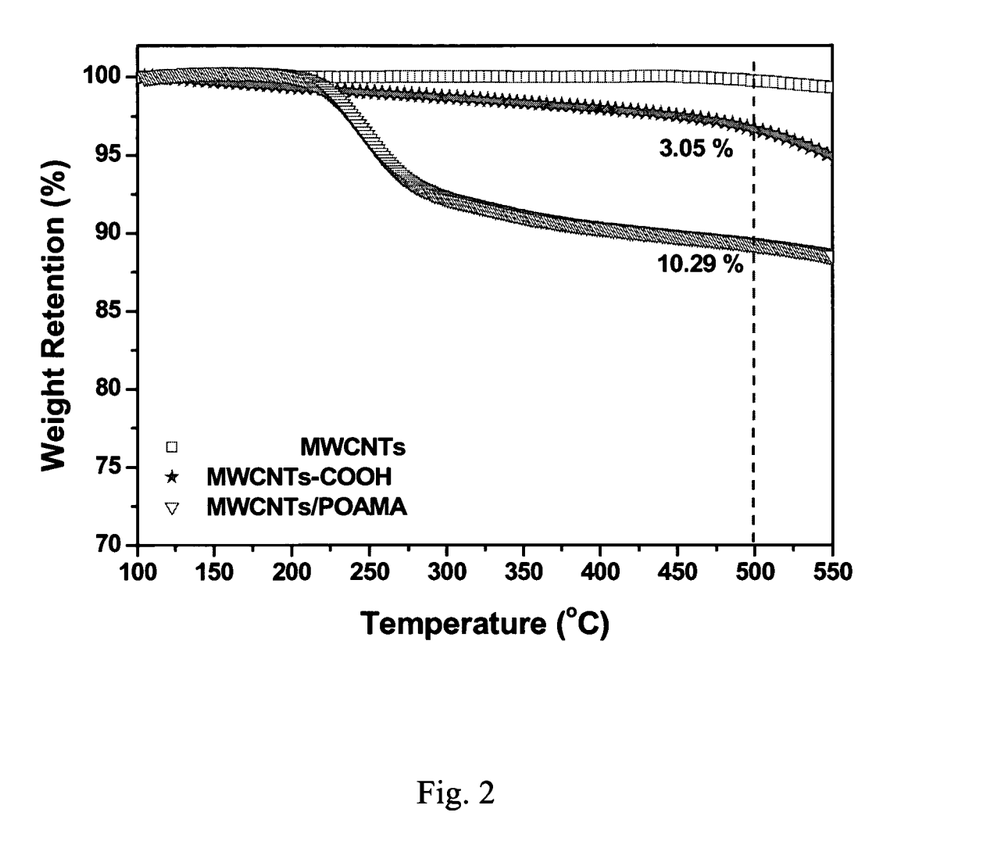
FIG. 2 is a plot of weight retention (%) versus heating temperature during thermogravimetric analysis (TGA) of pristine MWCNTS, acidified MWCNTs (MWCNTs-COOH), and the modified MWCNTs/POAMA for use in the present invention.

Organic molecules will decompose in advance to carbon nanotubes due to the relatively poor heat resistance of the organic molecules, when the modified MWCNTS are subjected to a heat treatment. Accordingly, the content of organic molecules in the modified MWCNTS is able to be calculated by TGA, wherein the modified MWCNTS were heated to 600° C. at a rate of 10° C./min under a nitrogen atmosphere. The residual weight of the modified MWCNTs was recorded versus the heating temperature, and the results thereof together with those of pristine MWCNTs are shown in FIG. 2. The content of organic molecules in the modified MWCNTS was determined as the weight lost at 500° C. As shown in FIG. 2, the pristine MWCNTs have only 0.6 wt % lost at 500° C., indicating that MWCNTs are thermally stable. On the contrary, MWCNTs-COOH and MWCNT/POAMA have 3.05 wt % and 10.29 wt % weight lost at 500° C., wherein the latter have a higher organic molecular content due to the molecular weight of POAMA being greater than that of nitric acid.

Preparation Example 2

Preparation of CNT-mPOP400-amine and CNT-mPOP2000-amine by Free-Radical Modification Scheme 2 depicts an overview of covalent grafting procedures for preparing the modified carbon nanotubes.

Scheme 2 mPOP-amine

CNT-mPOP-amine

The preparation of poly(oxypropylene) diamines with various molecular weights (Mw 400 and 2000 g/mol) bearing one maleic anhydride (abbreviated as mPOP-amine) was carried out in a glass reactor equipped with a stirrer. The designated amount of maleic anhydride (15.68 g, 160 mmol) was slowly added to a reactor charged with polyether amine (160 mmol), and then stirred mechanically at 25° C. for 24 h. In order to prepare carbon nanotubes modified by polyether amine (abbreviated as CNTs-mPOP-amine), first 12 g MWCNTs was suspended in 600 ml THF by shear mixed for 1 h and ultrasonication for 15 min. Subsequently, mPOP-amine-400 (1.33 g, 2.67 mmol) and mPOP-amine-2000 (5.6 g, 2.67 mmol) dissolved in 10 ml THF was slowly added into MWCNT suspension, and the mixture was further shear mixed at 80° C. by refluxing for 8 h. The free radical reaction was initiated by BPO. After the grafting polymerization, the mixture was separated by filtration through 0.2 polytetrafluoroethylene (PTFE) membrane and thoroughly washed with anhydrous THF several times to remove the residual mPOP-amine, and then dried in a vacuum oven at 100° C. overnight to remove the solvent. Through this method, the MWCNTs modified by polyether amine were obtained, CNT-mPOP400-amine and CNT-mPOP2000-amine).

Identification of CNT-mPOP400-amine and CNT-mPOP2000-amine by Free-Radical Modification Identification of Modified MWCNTs by Raman Spectrum Raman spectra were recorded with LabRam I confocal Raman spectrometer (Dilor, France). The excitation wavelength was 632.8 nm from a He—Ne laser with a laser power of ca. 15 mW at the sample surface. A holographic notch filter reflected the exciting line into an Olympus BX40 microscope (Tokyo, Japan). X-Ray photoelectron spectra (XPS) measurements were performed using a VG Scientific ESCALAB 220 iXL spectrometer equipped with a hemispherical electron analyzer and an Mg Kα (hv=1487.7 eV) X-ray source. A small spot lens system allowed analysis of a sample that was less than 1 $mm^2$ in area.

Figure 3:
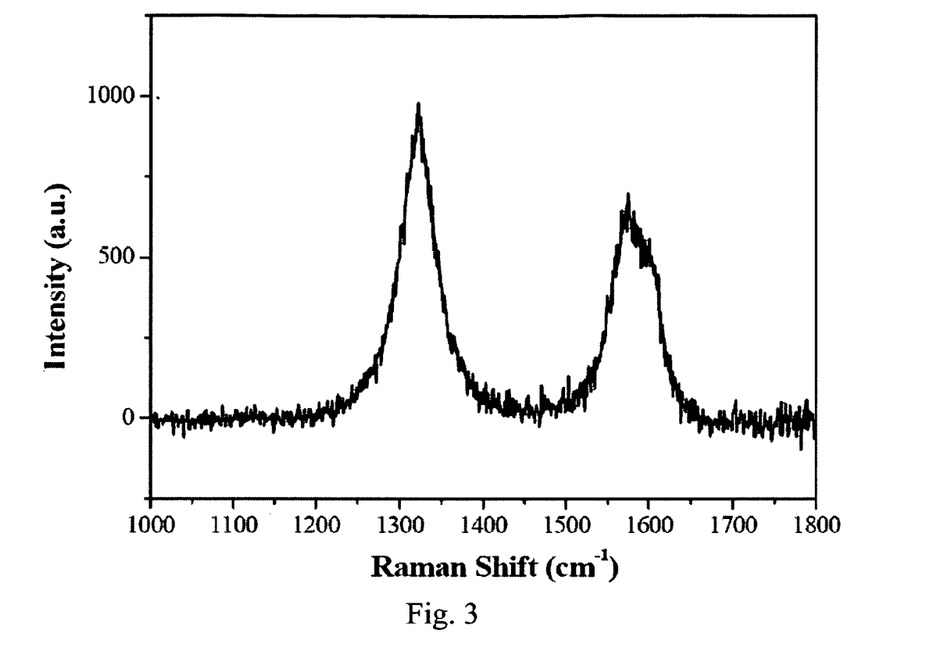
FIG. 3 is Raman spectra of the functionalized MWCNTs, CNT-mPOP400-amine for use in the present invention.
Figure 4:
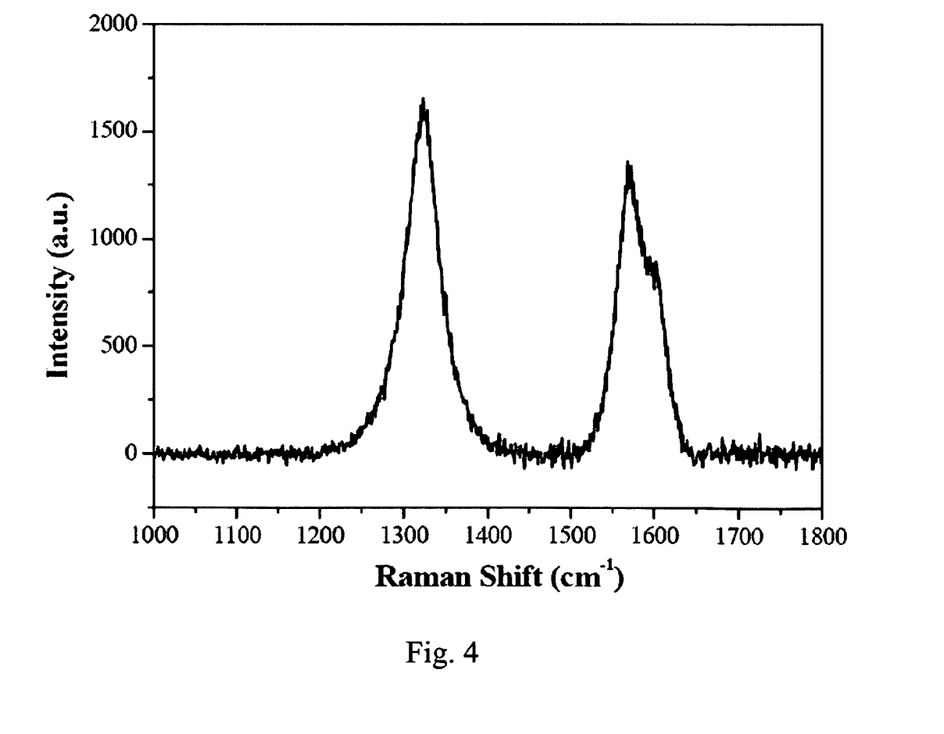
FIG. 4 is Raman spectra of the functionalized MWCNTs, CNT-mPOP2000-amine for use in the present invention.

Raman spectroscopy is a powerful tool to investigate the extent of disorder in the functionalized MWCNTs. FIG. 3 and FIG. 4 present the Raman spectra of MWCNTs after mPOP400-amine and mPOP-2000-amine grafting, respectively. The D- and G-bands at ~1322 $cm^{-1}$ and ~1570 $cm^{-1}$, respectively, attributed to defects/disorder-induced modes (or $sp^3$-hybridized carbons) and in-plane vibrations of the graphite wall (or $sp^2$-hybridized carbons), are clearly observable for functionalized MWCNTs. The extent of defects in graphite materials upon surface modification can be quantified by the area ratio of D- to G-bands (i.e. $D_a/G_a$). The $D_a/G_a$ area ratio of the pristine MWCNTs is ca. 0.96. For the CNT-mPOP400-amine, the $D_a/G_a$ area ratio is ~1.39, and for the CNT-mPOP2000-amine, the $D_a/G_a$ area ratio is ~1.41, showing increased $D_a/G_a$ values compared with pristine MWCNTs. Therefore, the increase in $D_a/G_a$ area ratios after functionalization reveals the formation of defects or functional group on the surfaces of MWCNTs due to covalently grafting of mPOP400-amine and m-POP2000-aminechains under free-radical modification.

Figure 5:
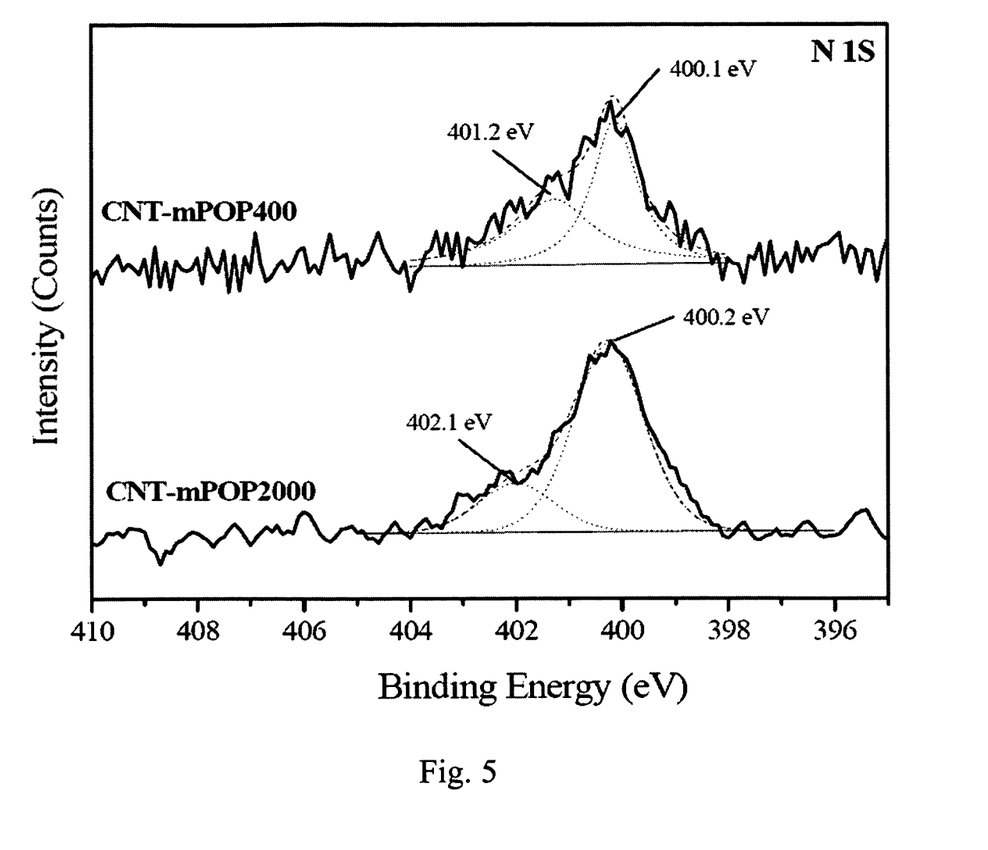
FIG. 5 is high-resolution N1s core-level XPS spectra of the surface of the functionalized MWCNTs, CNT-mPOA400-amine and CNT-mPOP2000-amine for use in the present invention.

High-Resolution N1s Core-Level X-Ray Photoelectron Spectroscopy (XPS) Spectra of the Surface of the Functionalized MWCNTs N1s core-level XPS spectra further confirm the presence of the amino and amine group of functionalized MWCNTs. Two main N1s peaks indicate two different nitrogen environments in the CNT-mPOP400-amine and CNT-mPOP2000-amine system, as shown in FIG. 5. The low binding-energy at 400 eV is the characteristic peak of nitrogen of the amine group placed in terminal position of m-POP chains, and the peaks at 401 eV and 402 eV are attributed to nitrogen of the amide group with linkage of mPOP400-amine and mPOP2000-amine chains and MWCNT walls. Therefore, these XPS results clearly indicate that the mPOP400-amine and mPOP2000-amine was covalently grafted onto the MWCNT surface.

Example 1

The graphite powder used in Example 1 consisted of not more than 10% of particles larger than 40 mesh (420 μm in diameter), about 40% of particles between 40 mesh and 60 mesh (420-250 μm in diameter), and about 50% of particles between 60 mesh and 80 mesh (250-177 μm in diameter).

Preparation of BMC Material and Specimen 1. 192 g of a solution was prepared by dissolving 144 g of vinyl ester resin resin and 16 g of styrene-monomer-diluted polystyrene (as a low shrinking agent) in 32 g of styrene monomer as a solvent. 3.456 g of TBPB was added as an initiator, 3.456 g of MgO was added as a tackifier, and 6.72 g of zinc stearate was added as a mold releasing agent.
2. The solution resulting from step 1, and 448 g of graphite powder were poured into a Bulk Molding Compound (BMC) kneader to be mixed homogeneously by forward-and-backward rotations for a kneading time of about 30 minutes. The kneading operation was stopped and the mixed material was removed from the mixer to be tackified at room temperature for 36 hours.
3. Prior to thermal compression of specimens, the material was divided into several lumps of molding material with each lump weighing 65 g.
4. A slab mold was fastened to the upper and lower platforms of a hot press. The pre-heating temperature of the mold was set to 140° C. After the temperature had reached the set point, the lump was disposed at the center of the mold and pressed with a pressure of 3000 psi to form a specimen.

After 300 seconds, the mold was opened automatically, and the specimen was removed.

Examples 2-4

The steps in Example 1 were repeated to prepare lumps of molding material and specimens, except that 1.98 g of various MWCNTs listed in Table 1 was added together with the graphite powder to the BMC kneader in step 2. Further in Example 4, 32.5 g of the BMC material was placed into the mold, a metallic net was then disposed on the BMC material and then another 32.5 g of the BMC material was placed on the metallic net before closing the mold in the hot pressing of step 4. The metallic net had a thickness 1 mm and was made of knotted stainless steel strings (diameter of 0.43 mm) with rectangular meshes of 2.2 mm×2.4 mm.

TABLE 1

| Example | Electrically conductive filler | Amount of pristine MWCNTs, g (wt %)* |
|---|---|---|
| 1 | — | — |
| 2 | Pristine MWCNTs | 1.98 (1%) |
| 3 | Modified MWCNTs (MWCNTs/POAMA) | 1.98 (1%) |
| 4 | Metal net and modified MWCNTs (metal met - MWCNTs/POAMA) | 1.98 (1%) |

*%, based on the weight of the vinyl ester resin solution prepared in Step 1.

Examples 5-8

The steps in Example 2 were repeated to prepare lumps of molding material and specimens, except that a polyether amine dispersant was added together with the MWCNTs used in step 2 or the MWCNTs used in step 2 were replaced with the modified MWCNTs prepared in Preparation Example 2. The amount of the dispersant and the modified MWCNTs added are listed in Table 2.

TABLE 2

| Example | MWCNTs/dispersant | Amount of pristine MWCNTs, g (wt %)* | Amount of dispersant or modified MWCNTs, g |
|---|---|---|---|
| 5 | Pristine MWCNTs/dispersant Jeffamine ® D400 | 1.98 (1%) | 0.55 |
| 6 | MWCNTs/dispersant Jeffamine ® D2000 | 1.98 (1%) | 2.21 |
| 7 | MWCNTs modified with Jeffamine ® D400 | 1.98 (1%) | 2.02 |
| 8 | MWCNTs modified with Jeffamine ® D2000 | 1.98 (1%) | 2.15 |

*%, based on the weight of the vinyl ester resin solution prepared in Step 1.

Electrical Properties:
Test Method:

A four-point probe resistivity meter was used by applying a voltage and an electric current on the surface of a specimen at one end, measuring at the other end the voltage and the electric current passed through the specimen, and using the Ohm's law to obtain the volume resistivity (ρ) of the specimen according to the formula, $$\rho = \frac{V}{I} * W * CF,$$ (formula 1)

wherein V is the voltage passed through the specimen, I is the electric current passed through the specimen, a ratio thereof is the surface resistivity, W is the thickness of the specimen, and CF is the correction factor. The thermally compressed specimens from the examples and the control example were about 100 mm×100 mm with a thickness of 1.2 mm. The correction factor (CF) for the specimens was 4.5. Formula I was used to obtain the volume resistivity (ρ) and an inversion of the volume resistivity is the electric conductivity of a specimen.

Results:

Table 3 shows the resistivity measured for the composite substrates prepared above, wherein the resin formulas are the same, and the content of graphite powder is 70 wt % with 1 wt % of different carbon nanotubes and without or with a metallic net embedded therein. Table 4 shows the electric conductivity measured for the composite substrates prepared above.

It can be seen from the data in Tables 3 and 4 that the addition of MWCNTs will decrease the resistivity of the composite substrate and increase the conductivity of the composite substrate (Example 2). This effect is further enhanced when modified MWCNTs are used or a polyether amine dispersant is used together with MWCNTs (Examples 3-8). The results of MWCNTs/POAMA (Example 3) and metallic net—MWCNTs/POAMA (Example 4) in Tables 3 and 4 show no significant differences, indicating that the metallic net embedded therein does not affect the surface resistivity thereof.

TABLE 3

| | Resistivity (mO) |
|---|---|
| Example 1 | 5.03 |
| Example 2 | 1.95 |
| Example 3 | 1.55 |
| Example 4 | 1.55 |
| Example 5 | 1.58 |
| Example 6 | 1.34 |
| Example 7 | 1.04 |
| Example 8 | 0.75 |

TABLE 4

| | Conductivity (S/cm) |
|---|---|
| Example 1 | 199 |
| Example 2 | 513 |
| Example 3 | 643 |
| Example 4 | 644 |
| Example 5 | 633 |
| Example 6 | 744 |
| Example 7 | 956 |
| Example 8 | 1340 |

Mechanical Property: Test for Flexural Strength
Method of Test: ASTM D790
Results:

Table 5 shows the test results of flexural strength for composite substrates prepared above, wherein the resin formulas are the same, and the content of graphite powder is 70 wt % with 1 wt % of different carbon nanotubes and without or with a metallic net embedded therein.

It can be seen from the data in Table 5 that the addition of MWCNTs will increase the flexural strength of the composite substrate (Example 2). This effect is further enhanced when modified MWCNTs are used or a polyether amine dispersant is used together with MWCNTs (Examples 3-8). The results of MWCNTs/POAMA (Example 3) and metallic net—MWCNTs/POAMA (Example 4) in Table 5 show that the metallic net embedded therein significantly improves the flexural strength thereof.

TABLE 5

|  | Flexural strength (MPa) |
| --- | --- |
| Example 1 | 28.54 ± 0.54 |
| Example 2 | 37.00 ± 1.30 |
| Example 3 | 39.16 ± 0.46 |
| Example 4 | 43.86 ± 0.78 |
| Example 5 | 38.84 ± 0.12 |
| Example 6 | 41.61 ± 0.39 |
| Example 7 | 42.26 ± 0.83 |
| Example 8 | 47.14 ± 0.34 |

Mechanical Property: Test for Impact Strength
Method of Test: ASTM D256
Results:

Table 6 shows the test results of notched Izod impact strength for composite substrates prepared above, wherein the resin formulas are the same, and the content of graphite powder is 70 wt % with 1 wt % of different carbon nanotubes and without or with a metallic net embedded therein.

It can be seen from the data in Table 6 that the addition of MWCNTs will increase the impact strength of the composite substrate (Example 2). This effect is further enhanced when modified MWCNTs are used or a polyether amine dispersant is used together with MWCNTs (Examples 3-8). The results of MWCNTs/POAMA (Example 3) and metallic net—MWCNTs/POAMA (Example 4) in Table 5 show that the metallic net embedded therein significantly improves the impact strength thereof.

TABLE 6

|  | Impact strength (J/m) |
| --- | --- |
| Example 1 | 62.38 |
| Example 2 | 70.73 |
| Example 3 | 118.48 |
| Example 4 | 170.51 |
| Example 5 | 79.99 |
| Example 6 | 85.65 |
| Example 7 | 105.94 |
| Example 8 | 108.50 |

Coefficient of Thermal Expansion
Method of Test: ASTM D-696
Results:

The dimension stability of the composite substrates during the temperature ramp from room temperature to an elevated temperature under the sunshine can be determined by measuring coefficient of thermal expansion thereof.

Table 7 lists coefficients of thermal expansion measured for some of the composite substrates prepared above. The measured coefficients of thermal expansion for the composite substrates prepared in Examples 2 and 5-8 as shown in Table 7 respectively are 25.0 μm/m° C., 21.3 μm/m° C., 20.4 μm/m° C., 18.7 μm/m° C. and 16.7 μm/m° C. The results indicate that addition of MWCNTs together with the polyether amine dispersant will better reduce the thermal expansion coefficient in comparison with the addition of MWCNTs alone. In comparison with the results of Example 2 and Example 6, the thermal expansion coefficient of the latter is 17% less than that of the former. The results also indicate that addition of modified MWCNTs will best enhance the thermal expansion coefficient among the cases where MWCNTs are added with or without the polyether amine dispersant. In comparison with the results of Example 2 and Example 8, the thermal expansion coefficient of the latter is 33% less than that of the former.

TABLE 7

|  | Coefficient of Thermal Expansion (μm/m ° C.) |
| --- | --- |
| Example 2 | 25.0 |
| Example 5 | 21.3 |
| Example 6 | 20.4 |
| Example 7 | 18.7 |
| Example 8 | 16.7 |

Example 9

The steps in Example 1 were repeated to prepare lumps of molding material and specimens, except that 1.98 g of various MWCNTs were added into the vinyl ester resin solution prepared in Step 1 and supersonicated for 30 minutes at room temperature prior to the addition of the graphite powder, and except that the amount of the graphite powder was changed from 448 g (70 wt %) to 512 g (80 wt %).

The resisitivity and flexural strength of the composite substrate prepared in this example are 2.1 mΩcm and about 29.5 MPa, respectively.

Testing the Performance of the DSSCs
Method for Test: Single Cell Test

The composite substrate prepared in this example and the conventional electrically conductive glass substrate were used as the substrates for the counter electrodes of DSSCs, and the performance thereof was compared.

Figure 6:
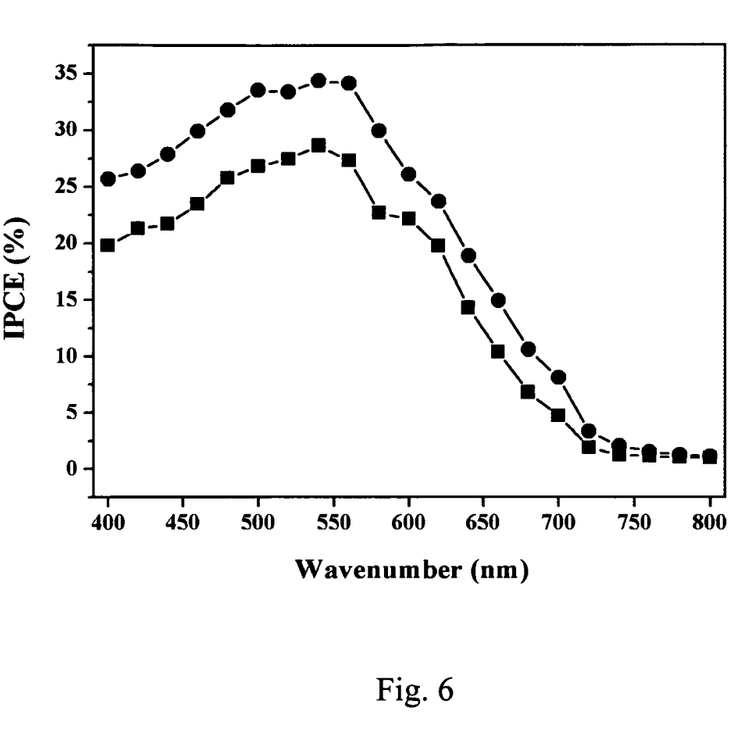
FIG. 6 shows incident photon conversion to charge carrier conversion efficiency (IPCE) of the DSSCs prepared by using the composite substrate prepared Example 9 of the present invention (circular dots) and by using the conventional electrically conductive glass substrate (square dots).

FIG. 6 shows incident photon conversion to charge carrier conversion efficiency (IPCE) of the DSSCs prepared by using the composite substrate prepared in this example (circular dots) and by using the conventional electrically conductive glass substrate (square dots), from which it can be seen that IPCE of the former is higher than that of the latter.

Figure 7:
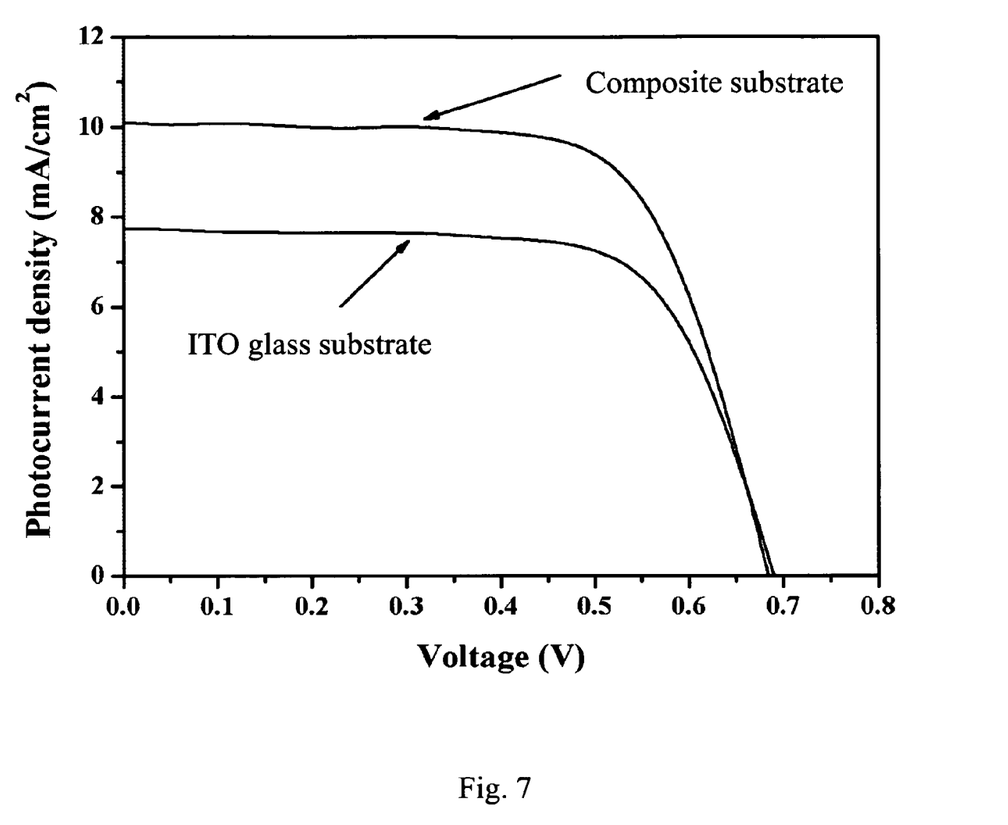
FIG. 7 shows curves between photocurrent density and voltage (J-V) for DSSCs prepared by using the composite substrate prepared Example 9 of the present invention and by using the conventional electrically conductive glass substrate.

FIG. 7 shows curves between photocurrent density and voltage (J-V) for DSSCs prepared by using the composite substrate prepared in this example and by using the conventional electrically conductive glass substrate, the data in which indicate that the electric current density of the former is generally higher than that of the latter at the same voltage. As shown in FIG. 7, the DSSC prepared by using the composite substrate prepared in this example has an open-circuit photovoltage ($V_{oc}$) of 0.68 V, a short-circuit photocurrent density ($J_{sc}$) of 10.11 mA/cm$^2$, a fill factor (FF) of 0.68, and a photoelectric conversion efficiency (η) of 4.73%, which are comparable to $V_{oc}$ of 0.69 V, $J_{sc}$ of 7.73 mA/cm$^2$, FF of 0.70, and η of 3.74% of the DSSC assembled from the conventional electrically conductive glass substrate except the $J_{sc}$. It is believed that the relatively higher $J_{sc}$ of the DSSC prepared by using the composite substrate prepared in this example is due to a relatively lower whole resistivity of the DSSC, which in turn causes the DSSC prepared by using the composite substrate prepared in this example has a relatively higher photocurrent. These results indicate that the composite substrate of the present invention is suitable to replace the conventional electrically conductive glass substrate as a substrate for counter electrodes of DSSCs.

The properties of the composite substrate of the present invention are compared to those of the related inventions in Table 8. As shown in Table 8, the electrically properties of the composite substrate of the present invention are better than those of the electrically conductive glass substrates which are commercially available.

TABLE 8

|  | Surface resistivity (Ω) | Whole resistivity of the DSSC[d] (kΩcm$^2$) | Preparation method |
|---|---|---|---|
| Example 9 | $2.9 \times 10^{-3}$ | 1.92 | BMC process |
| ITO[a] | 8.5 | 2.65 | CVD process |
| ITO/ATO[b] | 1.9 | 2.31 | CVD process |
| FTO[c] | 23.2 | 2.79 | CVD process |

[a]$In_2O_3$:Sn glass substrate available from Merck KGaA, Darmstadt, Germany
[b]$In_2O_3$:Sn/$SnO_2$:Sb glass substrate available from Geomatec Co. Ltd., Japan
[c]$SnO_2$:F glass substrate available from Solaronix Co., Switzerland
[d]Dye-sensitized solar cells (DSSCs) with Pt counter electrodes sputtered on the substrates The present invention has been described with a preferred embodiment thereof and it is understood that many changes and modifications to the described embodiment can be carried out without departing from the scope and the spirit of the invention that is intended to be limited only by the appended claims.

The invention claimed is:

1. A dye-sensitized solar cell comprising a photoanode, electrolyte, and counter electrode deposited directly on a composite substrate, wherein said composite substrate comprises a cured vinyl ester resin and a graphite powder dispersed in said cured vinyl ester resin, wherein said cured vinyl ester resin comprises 60 to 80 wt % of said graphite powder, based on the weight of said cured vinyl ester resin and particles of said graphite powder have a size of 10-80 mesh,
   wherein said composite substrate further comprises 0.01-10 wt % of an electrically conductive filler, based on the weight of the vinyl ester resin, is dispersed in said cured vinyl ester resin, wherein said electrically conductive filler is CNT, and said cured vinyl ester resin further comprises 0.01-10 wt % of a polyether amine dispersant, based on the weight of the cured vinyl resin,
   wherein said composite substrate further comprises a metallic net being embedded in said composite substrate.

2. The dye-sensitized solar cell as claimed in claim 1, wherein less than 10 wt % of the particles of the graphite powder are larger than 40 mesh, and the remaining particles of the graphite powder have a size of 40-80 mesh.

3. The dye-sensitized solar cell as claimed in claim 1, wherein said polyether amine is polyether diamine having two terminal amino groups, and having a weight-averaged molecular weight of 200-4000.

4. The dye-sensitized solar cell as claimed in claim 3, wherein the polyether diamine is poly(propylene glycol)-bis-(2-aminopropyl ether) or poly(butylene glycol)-bis-(2-aminobutyl ether).

5. The dye-sensitized solar cell as claimed in claim 1, wherein said CNT is a carbon nanohorn, a carbon nanocapsule, or a single-walled, double-walled or multi-walled carbon nanotube.

6. The dye-sensitized solar cell as claimed in claim 5, wherein said CNT is a single-walled, double-walled or multi-walled carbon nanotube having a diameter of 1-50 nm, a length of 1-25 μm, a specific surface area of 150-250 $m^2g^{-1}$, and an aspect ratio of 20-2500 $m^2/g$.

7. The dye-sensitized solar cell as claimed in claim 1, wherein said composite substrate is prepared by a process comprising the following steps:
   a) compounding vinyl ester and graphite powder to form a bulk molding compound (BMC) material, the graphite powder content ranging from 60 wt % to 95 wt % based on the total weight of the graphite powder and vinyl ester, and 0.01-10 wt % of CNT and 0.01-10 wt % of a polyether amine dispersant, based on the weight of the vinyl ester resin, being added during the compounding;
   b) molding the BMC material from step a) to form a composite substrate having a desired shaped at 80-200° C. and 500-4000 psi and wherein said molding comprises molding the BMC material with a metallic net being embedded in the molded BMC material.

8. The dye-sensitized solar cell as claimed in claim 7, wherein, prior to the compounding in step a), a free radical initiator in an amount of 1-10% is mixed with said vinyl ester resin, based on the weight of said vinyl ester resin.

9. The dye-sensitized solar cell as claimed in claim 8, wherein said free radical initiator is selected from the group consisting of peroxide, hydroperoxide, azonitrile, redox systems, persulfates, and perbenzoates.

10. The dye-sensitized solar cell as claimed in claim 9, wherein said free radical initiator is t-butyl peroxybenzoate.

11. The dye-sensitized solar cell as claimed in claim 7, wherein, prior to the compounding in step a), a mold releasing agent in an amount of 1-10%, based on the weight of said vinyl ester resin, is mixed with said vinyl ester resin.

12. The dye-sensitized solar cell as claimed in claim 11, wherein said mold releasing agent is wax or metal stearate.

13. The dye-sensitized solar cell as claimed in claim 12, wherein said mold releasing agent is metal stearate.

14. The dye-sensitized solar cell as claimed in claim 7, wherein, prior to the compounding in step a), a low shrinking agent in an amount of 5-20%, based on the weight of said vinyl ester resin, is mixed with said vinyl ester resin.

15. The dye-sensitized solar cell as claimed in claim 14, wherein said low shrinking agent is selected from the group consisting of styrene-monomer-diluted polystyrene resin, copolymer of styrene and acrylic acid, poly(vinyl acetate), copolymer of vinyl acetate and acrylic acid, copolymer of vinyl acetate and itaconic acid, and terpolymer of vinyl acetate, acrylic acid and itaconic acid.

16. The dye-sensitized solar cell as claimed in claim 15, wherein said low shrinking agent is styrene-monomer-diluted polystyrene resin.

17. The dye-sensitized solar cell as claimed in claim 7, wherein, prior to the compounding in step a), a tackifier in an amount of 1-10%, based on the weight of said vinyl ester resin, is mixed with said vinyl ester resin.

18. The dye-sensitized solar cell as claimed in claim 17, wherein said tackifier is selected from the group consisting of alkaline earth metal oxides, alkaline earth metal hydroxides, carbodiamides, aziridines, and polyisocyanates.

19. The dye-sensitized solar cell as claimed in claim 18, wherein said tackifier is calcium oxide or magnesium oxide.

20. The dye-sensitized solar cell as claimed in claim 7, wherein, prior to the compounding in step a), a solvent in an amount of 10-35%, based on the weight of said vinyl ester resin, is mixed with said vinyl ester resin.

21. The dye-sensitized solar cell as claimed in claim 20, wherein said solvent is selected from the group consisting of styrene monomer, alpha-methyl styrene monomer, chloro-styrene monomer, vinyl toluene monomer, divinyl toluene monomer, diallylphthalate monomer, and methyl methacrylate monomer.

22. The dye-sensitized solar cell as claimed in claim 21, wherein said solvent is styrene monomer.

23. The dye-sensitized solar cell as claimed in claim 7, wherein said vinyl ester is selected from the group consisting of bisphenol-A epoxy-based methacrylate, bisphenol-A epoxy-based acrylate, tetrabromo bisphenol-A epoxy-based methacrylate, and phenol-novolac epoxy-based methacrylate.

24. The dye-sensitized solar cell as claimed in claim 7, wherein said vinyl ester resin has a molecular weight of 500-10000.

25. The dye-sensitized solar cell as claimed in claim 23, wherein said vinyl ester resin is phenol-novolac epoxy-based methacrylate.

26. The dye-sensitized solar cell as claimed in claim 1, wherein said metallic net is made of a material selected from the group consisting of Al, Ti, Fe, Cu, Ni, Zn, Ag, Au and an alloy thereof, and the metallic net has a thickness of 0.01-3 mm, a mesh of 0.1-15 mm, and strings having a diameter of 0.01-3.0 mm.

27. The dye-sensitized solar cell as claimed in claim 7, wherein said molding in step b) comprises disposing a metallic net in a mold and introducing the BMC material from step a) into said mold.

28. The dye-sensitized solar cell as claimed in claim 7, wherein said molding in step b) comprises introducing 40-60 wt % of a predetermined amount of the BMC material from step a) into a mold; disposing a metallic net in the mold and on the BMC material introduced into the mold; and introducing the remaining 60-40 wt % of BMC material from step a) into said mold so that the metallic net is sandwiched by the BMC material.

29. The dye-sensitized solar cell as claimed in claim 7, wherein said metallic net is made of a material selected from the group consisting of Al, Ti, Fe, Cu, Ni, Zn, Ag, Au and an alloy thereof, and the metallic net has a thickness of 0.01-3 mm, a mesh of 0.1-15 mm, and strings having a diameter of 0.01-3.0 mm.

* * * * *